United States Patent
Goyal et al.

(10) Patent No.: US 10,031,990 B1
(45) Date of Patent: Jul. 24, 2018

(54) SYSTEM, METHOD, AND COMPUTER PROGRAM PRODUCT FOR ANALYZING X-PROPAGATION FAILURES IN FORMAL VERIFICATION

(71) Applicant: Cadence Design Systems, Inc., San Jose, CA (US)

(72) Inventors: Pradeep Goyal, Uttar Pradesh (IN); Deepak Yadav, Uttar Pradesh (IN); Jasmeet Singh Narula, Delhi (IN)

(73) Assignee: Cadence Design Systems, Inc., San Jose, CA (US)

(*) Notice: Subject to any disclaimer, the term of this patent is extended or adjusted under 35 U.S.C. 154(b) by 14 days.

(21) Appl. No.: 15/278,441

(22) Filed: Sep. 28, 2016

(51) Int. Cl.
*G06F 17/50* (2006.01)

(52) U.S. Cl.
CPC .................. *G06F 17/504* (2013.01)

(58) Field of Classification Search
CPC .............. G06F 17/5022; G06F 17/504; G06F 17/5045; G06F 17/5081; G06F 2217/66
See application file for complete search history.

(56) References Cited

U.S. PATENT DOCUMENTS

| | | | | |
|---|---|---|---|---|
| 8,402,405 B1* | 3/2013 | Chang | ................ | G06F 17/5022 716/106 |
| 9,058,452 B1* | 6/2015 | Chang | ................ | G06F 17/5022 |
| 2010/0313175 A1* | 12/2010 | Petlin | ................ | G06F 17/504 716/106 |
| 2016/0055287 A1* | 2/2016 | Hartung | ............. | G06F 17/5081 716/102 |

* cited by examiner

*Primary Examiner* — Nha Nguyen
(74) *Attorney, Agent, or Firm* — Mark H. Whittenberger, Esq.; Holland & Knight LLP

(57) ABSTRACT

The present disclosure relates to a computer-implemented method for electronic design verification. The method may include receiving, using a processor, an electronic design at a verification environment and generating a symbolic constant for use with the verification environment. The method may further include identifying a plurality of X sources associated with the verification environment and modifying the plurality of X sources based upon, at least in part, the symbolic constant. The method may also include running a first target node and if the first target node is proven, run at least one additional target node until all target nodes are proven.

14 Claims, 8 Drawing Sheets

SYSTEM, METHOD, AND COMPUTER PROGRAM PRODUCT FOR ANALYZING X-PROPAGATION FAILURES IN FORMAL VERIFICATION

FIELD OF THE INVENTION

The present disclosure relates to electronic design verification, and, more specifically, to a method for using X-Propagation analysis associated with electronic design verification.

DISCUSSION OF THE RELATED ART

In the electronic design automation ("EDA") field, an X-bug or X-value generally corresponds to a don't care value, an unknown value, or a wildcard value. For example, in the simulation of an electronic design, the standard hardware description language ("HDL") simulation semantics conceal X-bugs as they may not propagate X values in certain scenarios. This may happen due to X-optimism, which yields fewer unknown values resulting in hidden X-bugs. These bugs are generally uncovered during Gate Level Simulation which is too slow for modern System-on-a-chip ("SoCs"), and catching X-bugs at the Gate Level may involve added cost as it comes late in the cycle and results in further register transfer level ("RTL") iterations to fix the X-bugs. Any undriven net in a design is a potential X.

Low Power Designs are a major source of X's during simulation when power is being turned off or restored in some of the blocks. For example, in a low power design when a domain is powered off, it must be isolated from the rest of the system. This is achieved by using isolation logic which drives some valid values to powered on and active domains that were driven by the powered off domain. In the absence of isolation logic or due to bugs in isolation logic, X's from the powered off domain may get driven into the powered on domain resulting in corruption of logic in the active domains. The same problem may occur when power is being restored in a domain, the isolation logic needs to be removed but not before the power is completely restored and the domain starts driving correct values as per the logic inside the domain. Bugs in this sequence may again push X's to the connected domains.

SUMMARY OF DISCLOSURE

In one or more embodiments of the present disclosure, a computer-implemented method for electronic design verification is provided. The method may include receiving, using a processor, an electronic design at a verification environment and generating a symbolic constant for use with the verification environment. The method may further include identifying a plurality of X sources associated with the verification environment and modifying the plurality of X sources based upon, at least in part, the symbolic constant. The method may also include running a first target node and if the first target node is proven, run at least one additional target node until all target nodes are proven.

One or more of the following features may be included. In some embodiments, the method may further include if the first target node is a failure, fetching a symbolic constant value from a counter-example. The method may also include providing a path from a selected X source to the target node and running a second target node. In some embodiments, the symbolic constant may be assigned an arbitrary value for use throughout a verification process. The method may further include inserting at least one extra circuitry component to the verification environment. The at least one extra circuitry component may be configured to enable all X sources and to maintain a singular X source active non-deterministically. In some embodiments, the at least one extra circuitry component is a multiplexer.

In one or more embodiments of the present disclosure a computer-readable storage medium having stored thereon instructions, which when executed by a processor result in one or more operations is provided. Operations may include receiving, using a processor, an electronic design at a verification environment and generating a symbolic constant for use with the verification environment. Operations may further include identifying a plurality of X sources associated with the verification environment and modifying the plurality of X sources based upon, at least in part, the symbolic constant. Operations may also include running a first target node and if the first target node is proven, run at least one additional target node until all target nodes are proven.

One or more of the following features may be included. In some embodiments, the method may further include if the first target node is a failure, fetching a symbolic constant value from a counter-example. Operations may also include providing a path from a selected X source to the target node and running a second target node. In some embodiments, the symbolic constant may be assigned an arbitrary value for use throughout a verification process. Operations may further include inserting at least one extra circuitry component to the verification environment. The at least one extra circuitry component may be configured to enable all X sources and to maintain a singular X source active non-deterministically. In some embodiments, the at least one extra circuitry component is a multiplexer.

In one or more embodiments of the present disclosure, a system for electronic design verification is provided. The system may include one or more processors configured to receive an electronic design at a verification environment and to generate a symbolic constant for use with the verification environment. The at least one processor may be further configured to identify a plurality of X sources associated with the verification environment. The at least one processor may be further configured to modify the plurality of X sources based upon, at least in part, the symbolic constant. The at least one processor may be further configured to run a first target node and if the first target node is proven, run at least one additional target node until all target nodes are proven.

One or more of the following features may be included. In some embodiments, if the first target node is a failure, the at least one processor may be further configured to fetch a symbolic constant value from a counter-example. The at least one processor may be further configured to provide a path from a selected X source to the target node and run a second target node. The symbolic constant may be assigned an arbitrary value for use throughout a verification process. The at least one processor may be further configured to insert at least one extra circuitry component to the verification environment. The at least one extra circuitry component may be configured to enable all X sources and to maintain a singular X source active non-deterministically.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
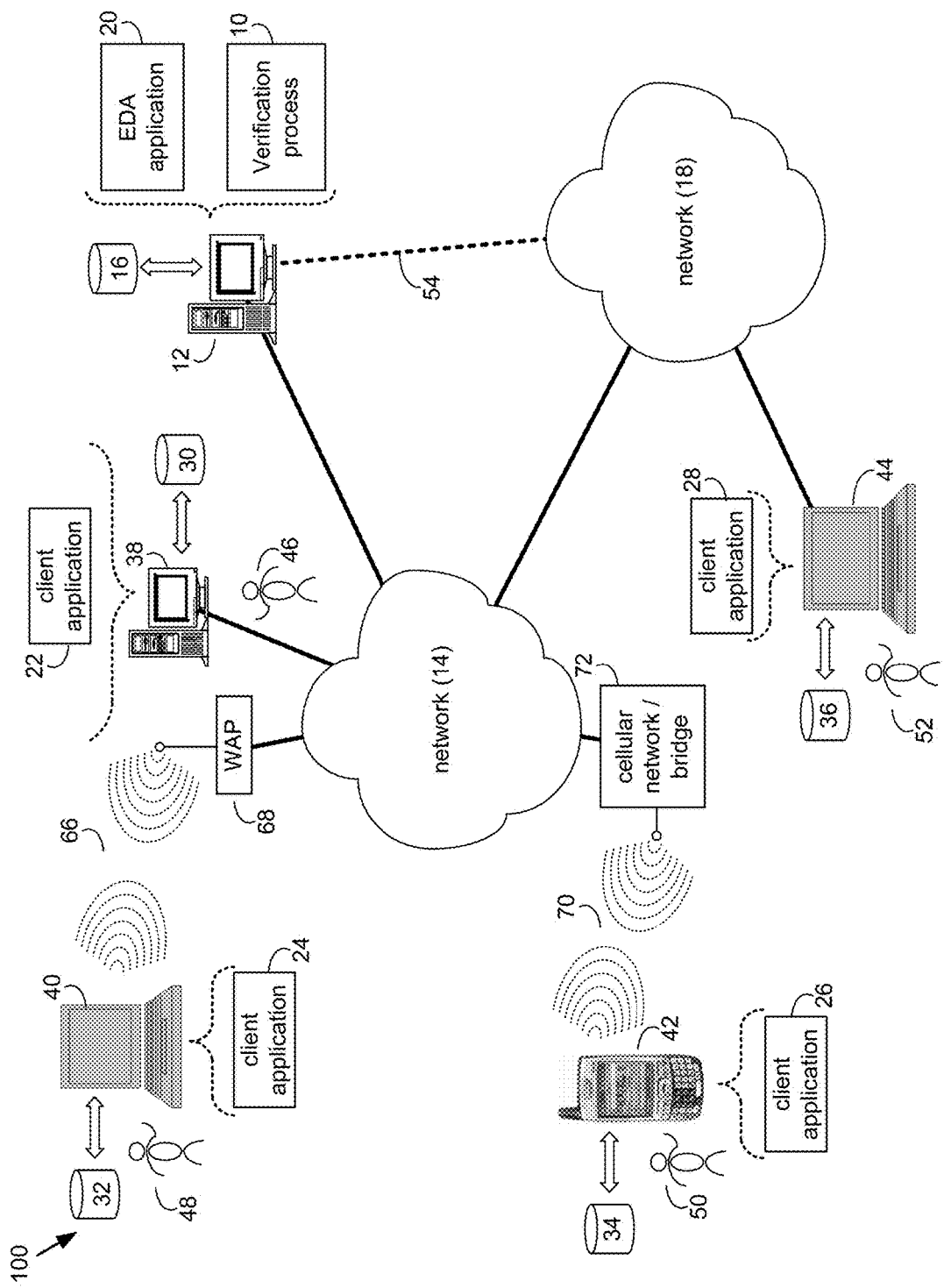
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a verification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Verification process 10 may be a stand alone application, or may be an applet/application/script that may interact with and/or be executed within EDA application 20. In addition/ as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18.

Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
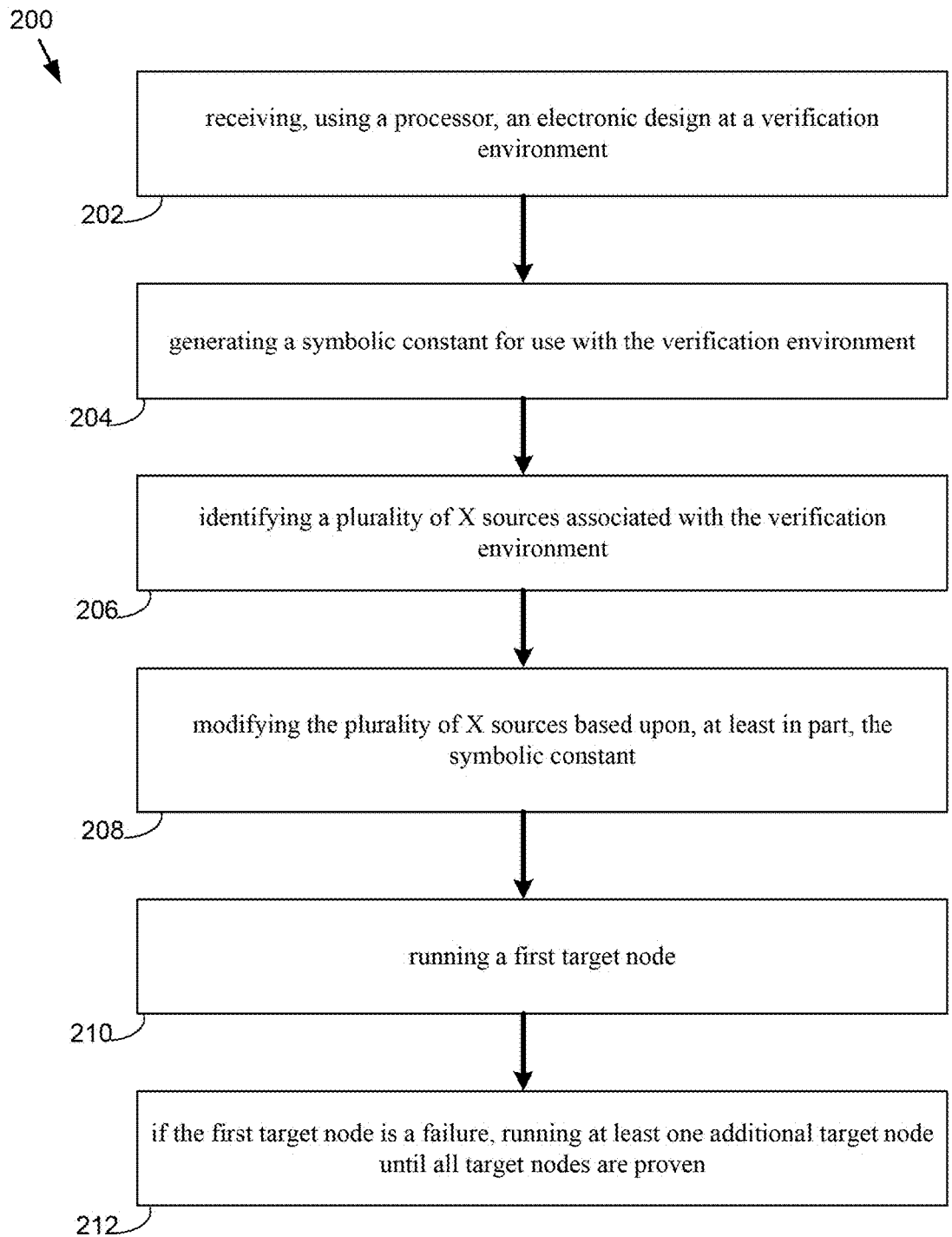
FIG. 2 is a flowchart depicting operations consistent with the verification process in accordance with an embodiment of the present disclosure.

Referring now to FIG. 2, an exemplary flowchart 200 depicting operations consistent with verification process 10 is provided. Operations may include receiving (202), using a processor, an electronic design at a verification environment and generating (204) a symbolic constant for use with the verification environment. The method may further include identifying (206) a plurality of X sources associated with the verification environment and modifying (208) the plurality of X sources based upon, at least in part, the symbolic constant. The method may also include running (210) a first target node and if the first target node is successful, running (212) at least one additional target node until all target nodes are proven. In some embodiments, the method may also include fetching a symbolic constant value from the CEX to determine which X-source reached the target (e.g., when the target node has failed).

Embodiments of verification process 10 may be configured to enable faster debug and analysis of "X" propagation failures using formal verification. As discussed above, one of the key challenges in the verification of a ASIC/SoC is "X" (unknown) propagation debug. "X" propagation may occur due to many reasons some of which may include, but are not limited to, uninitialized memory, timing violations, non-resettable flops, etc. "X" propagation bugs are very difficult to debug and may consume an enormous amount of time while challenging further increases due to the presence of hundreds/thousands of non resettable flops and other "X" sources which need to be traced separately for every X propagation.

Accordingly, any solution that can point to a unique "X" source that propagated to the target node (in a time efficient way) would reduce the "X" propagation failure analysis drastically. In this way, embodiments of verification process 10 may be configured to detect a unique "X" source for an "X" propagation failure using a formal verification technique. The analysis would introduce extra circuitry to the hardware design. In some embodiments, this extra circuitry may be configured to enable all "X" sources while keeping a single "X" source active non-deterministically. The formal verification analysis would then not only verify for "X" propagation but also generate relevant debug information from the analysis.

It should be noted that in existing technologies that are used to help debug "X" propagation failure are all post-processing solutions. The simulation or formal "X" propagation trace is loaded and multiple algorithms are applied to refine the trace to contain minimum "X" values. However, the primary issue with the current set of ideas is that the analysis is incomplete and based upon certain heuristics. So, the analysis may result in multiple X-sources still remaining in the trace or may select incorrect "X" source. Moreover, the analysis is extremely time consuming as for any realistic design, it may take days to finish the analysis.

As used herein, the term "proven" as it relates to X propagation may refer to a situation where no X source can propagate to this target node. The term "failed" may refer to a situation where an X source is able to propagate to the target node.

Figure 3:
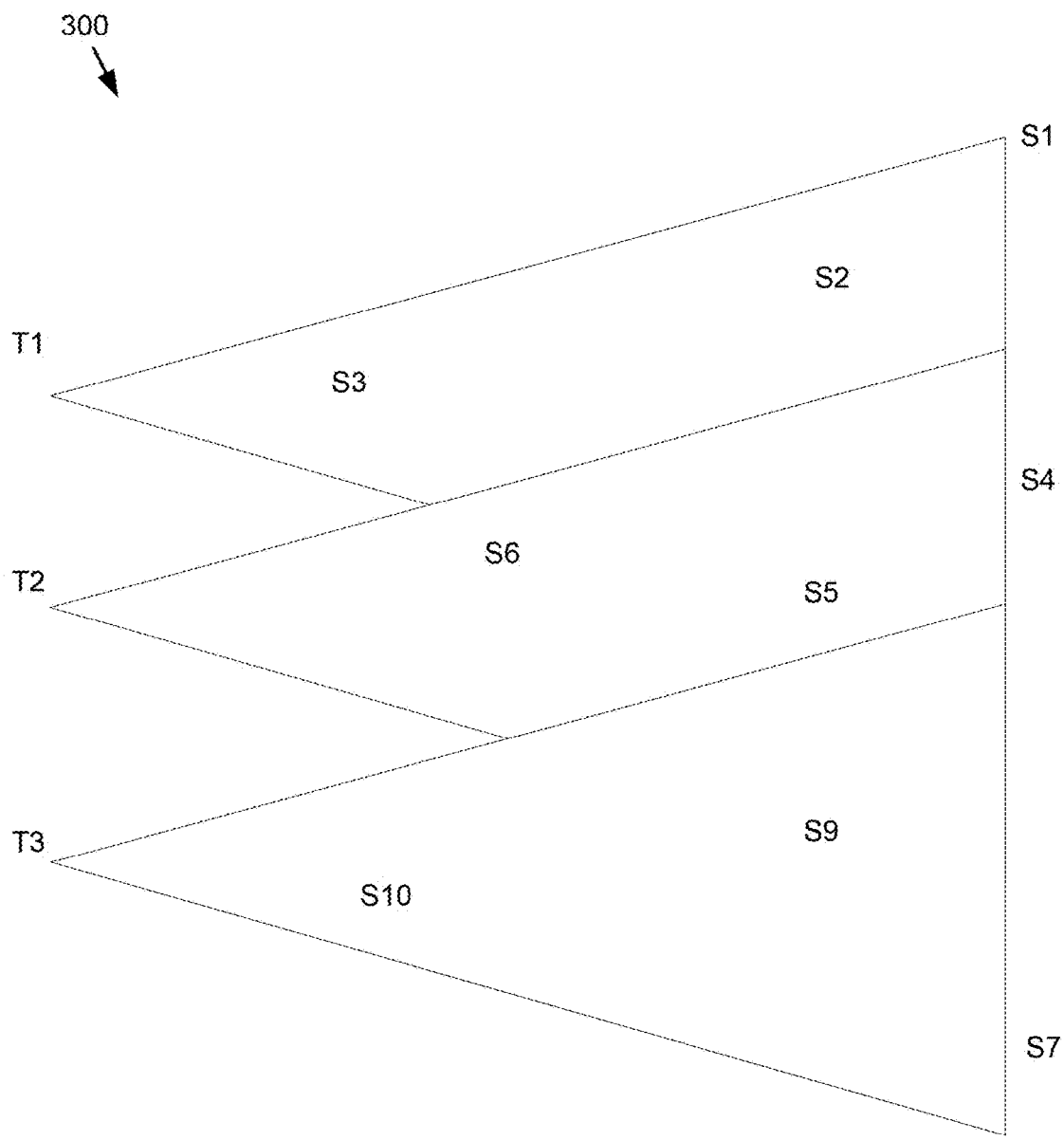
FIG. 3 is a diagram depicting an example of an X-propagation problem modeled for formal verification in accordance with the present disclosure.

Referring now to FIG. 3, an embodiment 300 depicting an example of an X-propagation problem modeled for formal verification in accordance with the present disclosure is provided. FIG. 3 shows the "X" propagation problem modeled for formal verification. A set of target nodes (e.g., T1 to T3) and a set of potential "X" source nodes (e.g., S1 to S10) may be identified.

Figure 4:
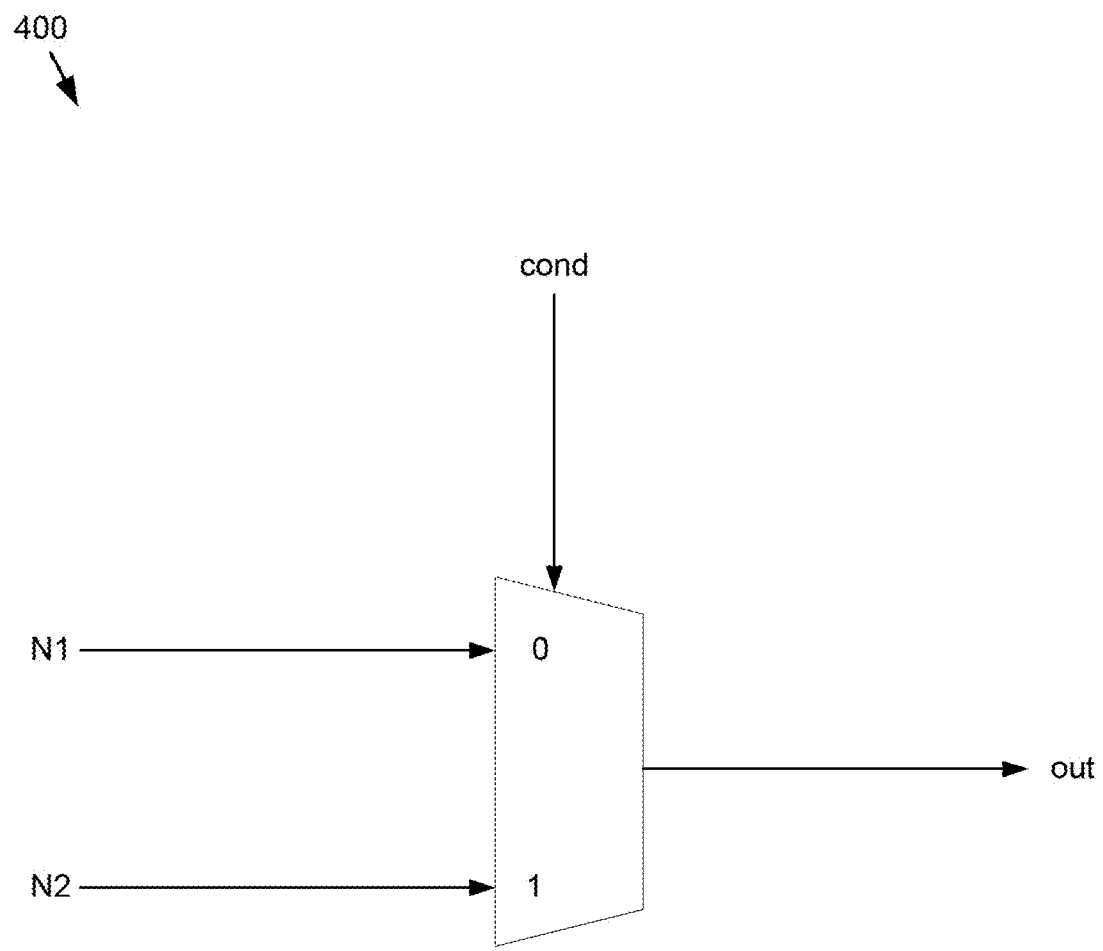
FIG. 4 is a diagram depicting an example of multiplexer logic in accordance with an embodiment the present disclosure.

FIG. 4 shows a diagram depicting an example of multiplexer logic in accordance with an embodiment the present disclosure. Here, it is shown that whenever there is an "X" failure at any target node, a single "X" source may always cause it keeping the other "X" sources as free inputs. FIG. 4 includes multiplexer logic where based upon a certain condition "cond" data, "N1" or "N2" would propagate to "out". Consider that "N2" data has an "X" value. However, if "cond" is always a constant value 0, the "X" would never propagate to the "out". Additionally and/or alternatively, if "cond" is 1 or "X", the "X" value from N2 may propagate to the "out". If the "X" can reach at "cond" through some "X" source S1, value 1 may also reach at "cond" if the "X" source becomes a "free" input.

Figure 5:
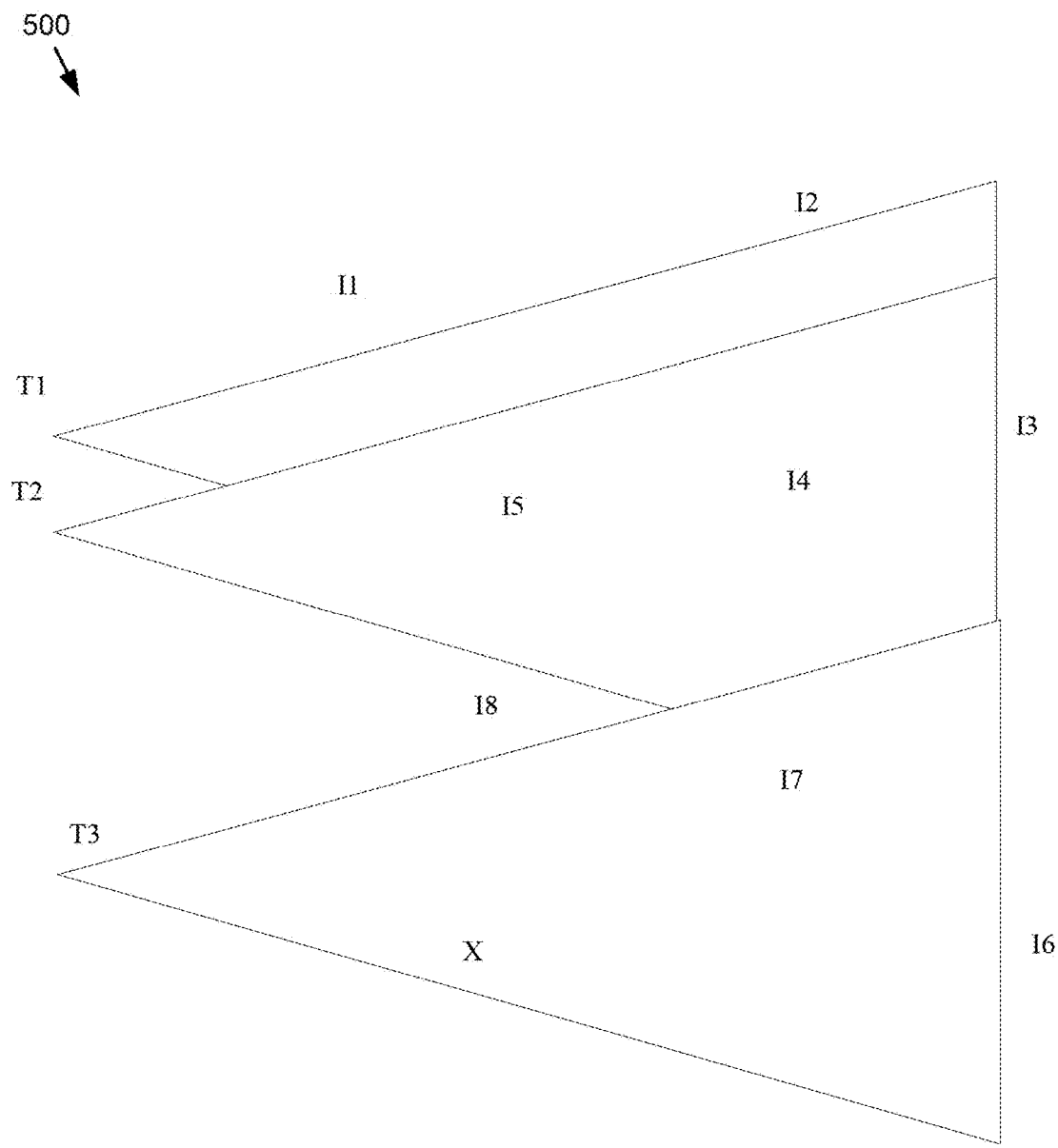
FIG. 5 is a diagram depicting an example of the difficulties in performing formal verification using the approach of FIG. 4.

FIG. 5 is a diagram depicting an example of the difficulties in performing formal verification using the approach of FIG. 4. As shown in the figure, one option may include considering each individual "X" source one by one leaving others as "free" inputs and performing formal verification analysis for a given target. However, considering thousands of "X" sources and a large number of target nodes, the analysis would be extremely expensive in time and would not be practical. As shown in the Figure, one of the inputs I1 . . . I9 is depicted as an "X".

Figure 6:
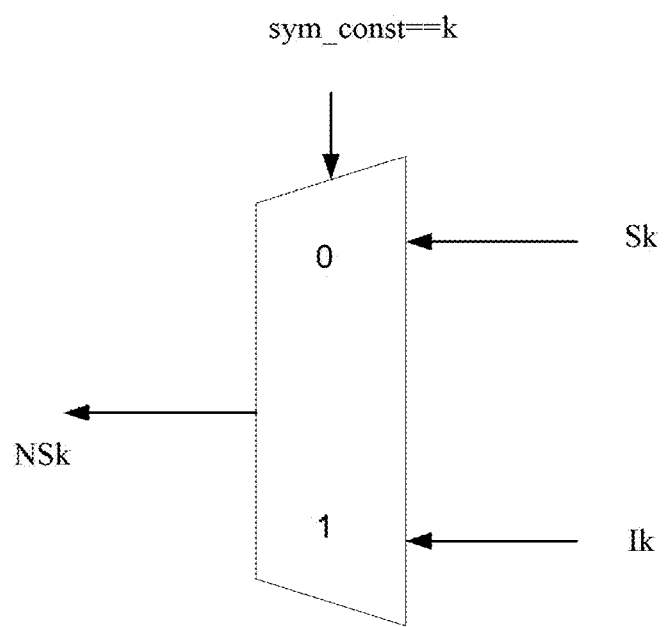
FIG. 6 is a diagram depicting an example of multiplexer logic in accordance with an embodiment the present disclosure.

FIG. 6 is a diagram depicting an example of multiplexer logic in accordance with an embodiment the present disclosure. More specifically, the multiplexer logic may be configured to model a single "X" source behavior in the circuit depending upon the value of the symbolic constant. The symbolic constant may take any non-deterministic value at the beginning of the run and retains that value throughout the verification process. For any value "K" picked, the Kth source remains as "X" source and others become "free" inputs. Here, Sk may be the X-source, Ik may be the input and NSk may refer to the new source.

Figure 7:
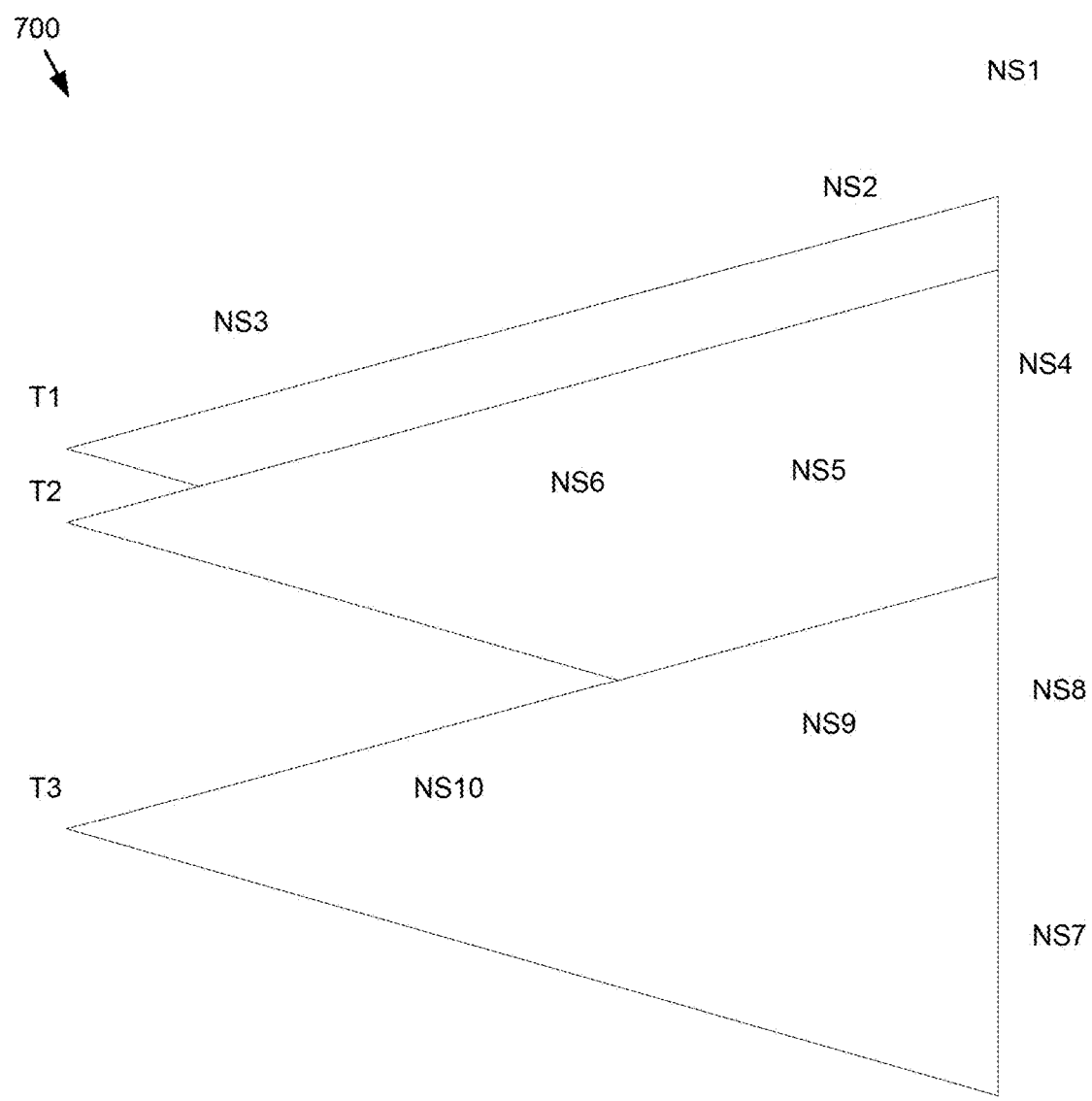
FIG. 7 is a diagram depicting an example applying the circuitry of FIG. 6 with a remodeled design in accordance with an embodiment the present disclosure.

FIG. 7 is a diagram depicting an example applying the circuitry of FIG. 6 with a remodeled design in accordance with an embodiment the present disclosure. As shown in FIG. 7, we apply the same circuitry to all the potential "X" sources and remodel the design. As we get an "X" propagation failure, the process may include looking for the value that the formal verification engines assumed for the symbolic constant. Depending on the value, it may be inferred which "X" source caused the failure at the target node.

Figure 8:
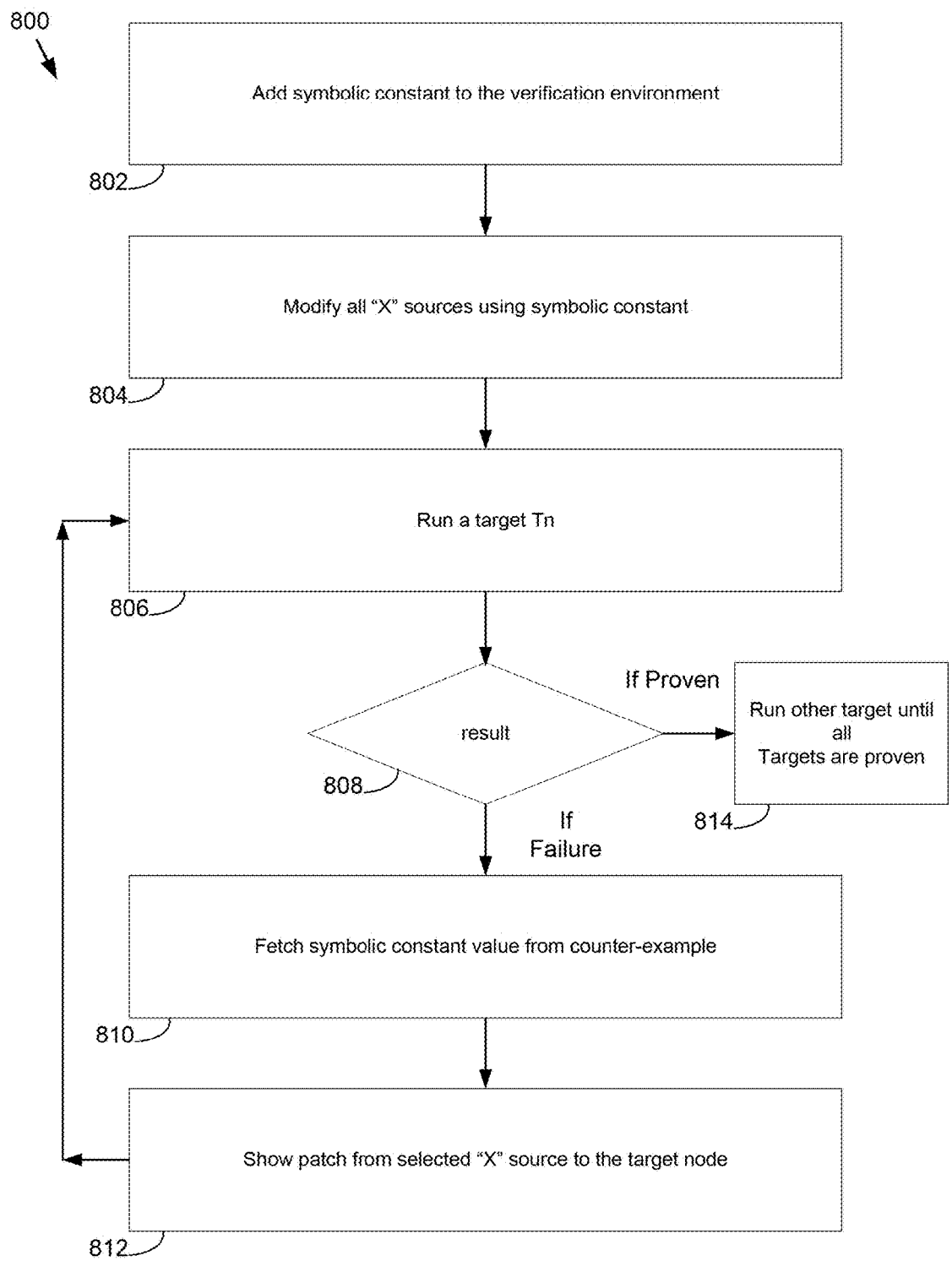
FIG. 8 is a flowchart depicting operations consistent with the verification process in accordance with an embodiment of the present disclosure.

FIG. 8 is a flowchart depicting operations consistent with the verification process in accordance with an embodiment of the present disclosure. The process may include adding (802) the symbolic constant to the verification environment and modifying (804) all "X" sources using the symbolic constant. The process may further include running (806) a target Tn and analyzing (808) a result. If the result is proven, the other targets may be run (814) until all targets are proven. If the result is a failure, the process may include fetching (810) a symbolic constant value from a counter-example and showing 812 a patch from selected "X" source to the target node. The process may repeat at step 806.

As discussed above, the primary problem with the current solutions is that none of them provide an accurate single "X" source. The other problem is that these solutions are time consuming making it really hard to be used in realistic scenarios. Embodiments of the present disclosure may solve these problems by taking the solution from the post-processing stage to the verification problem modeling stage. In some embodiments, some additional circuitry may be added to the design under verification so that the "X" propagation failure analysis from formal verification not only provides the verification result but also provides the debug information quickly and accurately.

The current conventional implementation is heavily dependent on the post-processing of the given trace. In contrast, embodiments of the present disclosure may actually re-model the verification problem in such a way that the debug information is also part of verification problem. Hence, this allows extracting relevant debug information from the verification results quickly and accurately.

Embodiments of verification process 10 may be used to extract accurate debug information about the single "X" source for a given "X" propagation failure. The other advantages is that the information is readily available as part of verification result and hence it is time efficient. Finally, the debug trace is the shortest possible trace that reduces the analysis time.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design verification comprising:
receiving, using a processor, an electronic design at a verification environment;
generating a symbolic constant for use with the electronic design and the verification environment, wherein the symbolic constant is assigned an arbitrary value for use throughout a verification process;
identifying a plurality of X sources associated with the electronic design and the verification environment;
modifying the plurality of X sources based upon, at least in part, the symbolic constant;
running a first target node associated with the electronic design and the verification environment;
if the first target node is proven, running at least one additional target node until all target nodes are proven;
if the first target node is a failure, fetching a symbolic constant value from a counter-example; and
generating an integrated circuit after all target nodes are proven.

2. The computer-implemented method of claim 1, further comprising:
providing a path from a selected X source to the target node; and
running a second target node.

3. The computer-implemented method of claim 1, further comprising:
inserting at least one extra circuitry component to the verification environment.

4. The computer-implemented method of claim 3, wherein the at least one extra circuitry component is configured to enable all X sources and to maintain a singular X source active non-deterministically.

5. The computer-implemented method of claim 3, wherein the at least one extra circuitry component is a multiplexer.

6. A computer-readable storage medium for electronic design verification, the computer-readable storage medium having stored thereon instructions that when executed by a machine result in one or more operations, the operations comprising:
receiving, using a processor, an electronic design at a verification environment;
generating a symbolic constant for use with the verification environment, wherein the symbolic constant is assigned an arbitrary value for use throughout a verification process;
identifying a plurality of X sources associated with the verification environment;
modifying the plurality of X sources based upon, at least in part, the symbolic constant;
running a first target node;
if the first target node is proven, running at least one additional target node until all target nodes are proven;
if the first target node is a failure, fetching a symbolic constant value from a counter-example; and
generating an integrated circuit after all target nodes are proven.

7. The computer-readable storage medium of claim 6 further comprising:
providing a path from a selected X source to the target node; and
running a second target node.

8. The computer-readable storage medium of claim 6, further comprising:
inserting at least one extra circuitry component to the verification environment.

9. The computer-readable storage medium of claim 8, wherein the at least one extra circuitry component is configured to enable all X sources and to maintain a singular X source active non-deterministically.

10. The computer-readable storage medium of claim 8, wherein the at least one extra circuitry component is a multiplexer.

11. A system for electronic design verification comprising:
> a computing device having at least one processor configured to receive an electronic design at a verification environment and to generate a symbolic constant for use with the verification environment, wherein the symbolic constant is assigned an arbitrary value for use throughout a verification process, the at least one processor is further configured to identify a plurality of X sources associated with the verification environment, the at least one processor is further configured to modify the plurality of X sources based upon, at least in part, the symbolic constant, the at least one processor is further configured to run a first target node and if the first target node is proven, run at least one additional target node until all target nodes are proven if the first target node is a failure, the at least one processor is further configured to fetch a symbolic constant value from a counter-example, generating an integrated circuit after all target nodes are proven.

12. The system of claim 11, wherein the at least one processor is further configured to provide a path from a selected X source to the target node and run a second target node.

13. The system of claim 11, wherein the at least one processor is further configured to insert at least one extra circuitry component to the verification environment.

14. The system of claim 11, wherein the at least one extra circuitry component is configured to enable all X sources and to maintain a singular X source active non-deterministically.

* * * * *